United States Patent [19]

Smetana

[11] 4,178,775
[45] Dec. 18, 1979

[54] CRYOSTAT ASSEMBLY

[75] Inventor: Daryl L. Smetana, West Covina, Calif.

[73] Assignee: Ford Aerospace and Communications Corporation, Newport Beach, Calif.

[21] Appl. No.: 943,594

[22] Filed: Sep. 18, 1978

[51] Int. Cl.² ............................................. F25B 19/00
[52] U.S. Cl. ................................................. 62/514 JT
[58] Field of Search ..................................... 62/514 JT

[56] References Cited

U.S. PATENT DOCUMENTS

| 3,048,021 | 8/1962 | Coles et al. | 62/514 JT |
| 3,063,260 | 11/1962 | Dennis | 62/514 JT |
| 3,457,730 | 7/1969 | Berry et al. | 62/514 JT |
| 3,926,011 | 12/1975 | Sollami | 62/514 JT |

FOREIGN PATENT DOCUMENTS 1155582 12/1957 France .................. 62/514 JT

Primary Examiner—Ronald C. Capossela

Attorney, Agent, or Firm—Peter Abolins; Clifford L. Sadler

[57] ABSTRACT

This specification discloses a cryostat assembly for a refrigerated infrared detector unit which includes an interior recess having therein a coolant conduit. The recess is partly bounded by a cylindrical wall and the coolant conduit has an exit nozzle which releases coolant tangential to the wall so that the noise of the coolant impact against the walls of the recess is reduced. Further, the coolant conduit is electrically conductive and has sufficient surface area to remove electrostatic charge from the coolant. The reduction of acoustical noise of the coolant impact against the recess walls and the discharge of an electrically charged coolant permits elimination of an electrically conductive coating on the walls of the recess and greatly simplifies production. Still further, the positioning of the coolant conduit and coils abutting the recess boundary serves to support and position the conduit exit nozzle.

12 Claims, 5 Drawing Figures

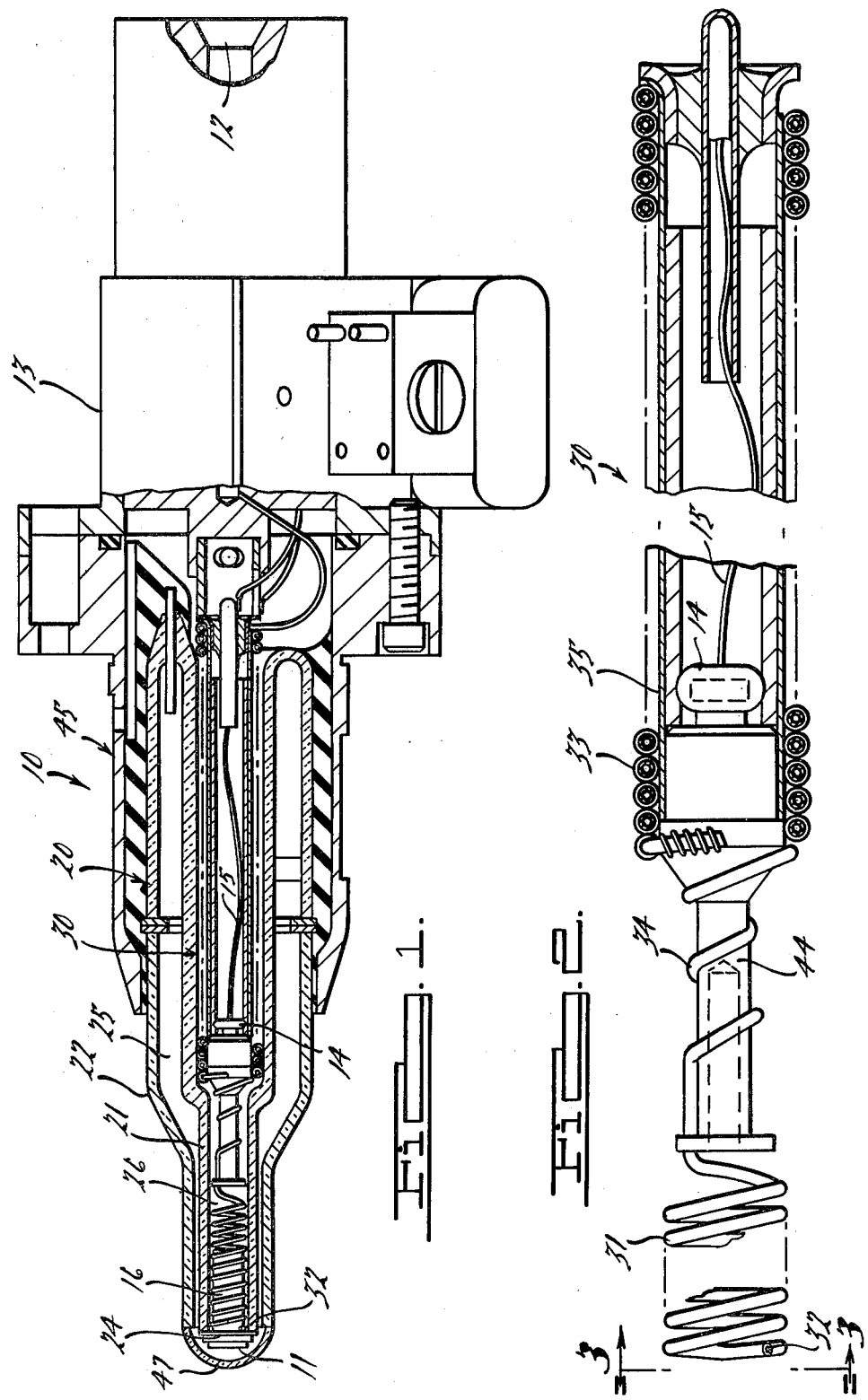

CRYOSTAT ASSEMBLY

BACKGROUND OF THE INVENTION (1) Field of the Invention

This invention relates to cooling assemblies and, in particular, to refrigerated detector units including a cryostat, for detecting an electromagnetic variable.

(2) Prior Art

Infrared detectors for use in such applications as missiles guidance are known in the prior art. For example, the Chaparral and Sidewinder missiles both use refrigerated detector units to sense infrared radiation used to guide the missile. Cooling of the infrared detector is necessary because the infrared detector functions only at about 77° Kelvin.

In some cryostat heat transfer devices for cooling the infrared detector, a material such as air or nitrogen is supplied at a relatively high pressure, for example, at 3000 pounds per square inch. The coolant is supplied in a gaseous state to the cryostat wherein the adiabatic expansion of the coolant changes the coolant from a gaseous to a liquid state. The low temperature of the coolant lowers the temperature of the infrared detector. Heat is also absorbed as the coolant subsequently changes from a liquid back to a gaseous state thereby cooling the incoming gas.

The construction of prior art refrigerated detector unit cryostat assemblies has utilized a thermos type or dewar flask wherein a vacuum is created between an inner and an outer wall. Typically, the coolant is introduced into a generally cylindrical recess defined by the inner wall and the infrared device is mounted in the vacuum on the inner wall. Also, the inside of the inner wall and the outside of the outer wall are coated with a metallic, conductive material such as silver. This material is grounded and acts as a discharge path for any electrostatic charge on the coolant gas. Such electrostatic charge on the coolant gas is undesirable because it contributes electrostatic noise to the infrared detector and hinders detection of infrared radiation.

In addition to reducing electrostatic noise, a silver coating also shields the detector from various acoustical or microphonic noises such as caused by the impact of the coolant on the inner wall. In particular, the coolant is discharged into the recess from a coolant tube positioned along a radius of the generally cylindrical recess and is directed at the cylindrical wall of the recess. The coolant striking against the cylindrical wall causes the microphonic or acoustical noise which adversely affects the performance of the infrared detector by increasing the noise in the detected signal.

Further, a silver coating on the glass also reduces the noise of cryostat cycling. The cryostat cycling occurs when a temperature sensing device in the cryostat senses that a valve needs to be opened to admit coolant into the recess adjacent the infrared sensor to cool the sensor. The opening and the closing of the valve admitting the gas causes an undesirable cycling noise which is picked up by the infrared detector.

Although the silver coating on the inside of the inner wall and the outside of the outer wall performs a useful function, the inner coating is particularly disadvantageous because of the difficulty in applying a uniform silver coating, the costs of the process, and an undesirable large loss of product when fabricating a dewar flask assembly. Indeed, not only is the actual fabrication of the silver coated inner glass difficult, but the thorough testing of a completed dewar flask assembly, such as is required for use in a missile, sometimes produces thermal and/or mechanical stresses sufficient to cause breakage or degradation of the silver coated glass wall. The silver used has glass particles in its composition. When fired on, the silver actually bonds and becomes part of the glass wall. The thermal coefficients of expansion of the glass and silver are very close. It is believed that the strength of the glass lies at the surface and silver migration weakens this glass strength.

Because of the difficulty and cost of producing and testing such silver coated glass, it would be desirable to eliminate the need for silver coated glass. However, removal of the silver coating must not increase the low level of electrostatic noise, cycling noise and of acoustical or microphonic noise.

SUMMARY OF THE INVENTION

This invention recognizes that it is possible to omit a conductive coating for an insulating material defining the recess walls of a container such as a dewar for holding the coolant in a cryostat assembly without an undesirable increase in electrostatic noise, cycling noise and acoustical or microphonic noise. By introducing the coolant into the coolant recess of the dewar in a direction tangential to the dewar wall, the noise of the coolant impinging the wall is substantially reduced. Thus, this invention recognizes that a particular position of the exit nozzle of the coolant conduit can significantly simplify production by removing the requirement of having an electrically conductive or silver coating on the recess wall.

In accordance with an embodiment of this invention, a cryostat assembly for an infrared detection device includes a substantially electrically insulating interior wall member for defining at least a portion of the boundary of a recess. The recess is adapted to contain a coolant such as, for example, nitrogen. The interior wall member has a cylindrical portion for defining a portion of the recess. A cryostat including coolant conduit means is positioned within the recess for guiding the coolant and has an exit nozzle for discharging the coolant from the conduit means at a position adjacent the cylindrical portion and in a direction tangential to an adjacent portion of the cylindrical portion. The discharge of the coolant is such as to reduce the force of impingement of the coolant on the cylindrical portion with respect to a radial impingement of the coolant on the cylindrical portion.

BRIEF DESCRIPTION OF THE DRAWINGS

FIG. 1 is a longitudinal view, partly in cross section, of a Refrigerated Detector Unit (RDU) in accordance with an embodiment of this invention;

FIG. 2 is an enlarged view of the central core of the cryostat assembly of FIG. 1 including the coolant conduit tubing in accordance with an embodiment of this invention;

DETAILED DESCRIPTION OF THE INVENTION

Figure 5:
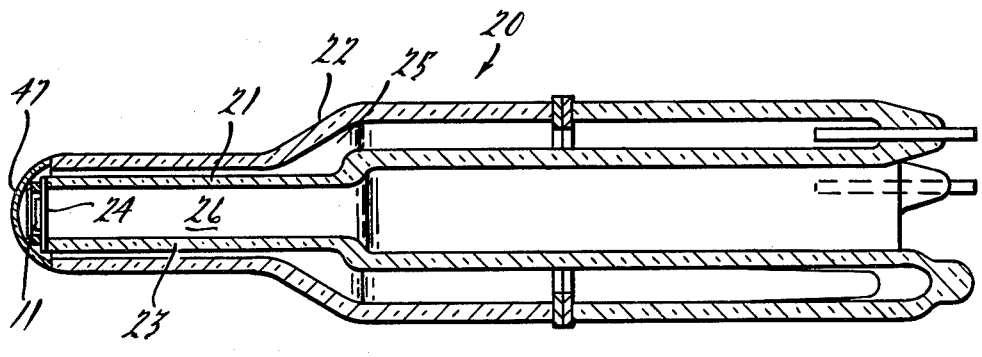
FIG. 5 is a longitudinal sectional view of the dewar flask assembly portion of the RDU of FIG. 1 in accordance with an embodiment of this invention.

Referring to FIG. 1, a refrigerated detector unit 10 includes a cryostat assembly 30, separately shown in FIG. 2, for cooling an infrared detector 11, a dewar flask and holder assembly 45, a dewar flask assembly 20 separately shown in FIG. 5, and a valve assembly 13. Infrared detector 11 is attached to the interior of flask assembly 20. Additionally, cryostat assembly 30 includes a temperature sensing element 14 connected by a sensing lead 15 to a connector located on a valve assembly 13. Valve assembly 13 includes a female gas probe receptacle 12 for receiving a coolant gas such as air or nitrogen to be supplied through cryostat 30 to an interior recess 26 of flask assembly 20. Valve assembly 13 includes a selectively operable valve responsive to an exterior trigger circuit which reacts to the temperature of the interior of cryostat 30. When the interior temperature is too high, the trigger circuit opens valve assembly 13 admitting coolant from gas probe receptacle 12 into cryostat 30. Conducting leads, not shown, extend into flask assembly 20 for connection to infrared detector so that an output signal can be transmitted in response to infrared radiation detected by detector 11.

Referring to FIG. 5, flask assembly 20 includes an inner flask 21 having a generally cylindrical portion 23 which is capped at one end with a generally disk shaped end cap 24. An outer flask 22 is spaced from the cylindrical portion 23 of inner flask 21 and defines therebetween a chamber 25 for a vacuum. At the end opposite end cap 24, inner flask 21 is joined to outer flask 22 so that chamber 25 is sealed and has a general cup shape. Typical material for flasks 21 and 22 is a borosilicate glass. Similarly, end cap 24 can be a borosilicate glass which is fused to the inner flask. Infrared detector 11 can be attached to the inner flask end cap by an adhesive.

Figure 3:
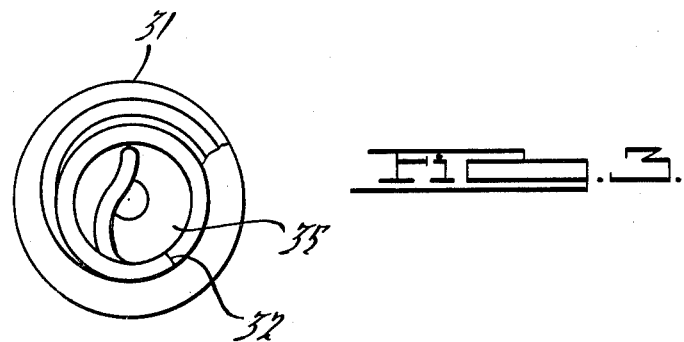
FIG. 3 is an end view of FIG. 2 taken along section line 3—3 of FIG. 2.

Referring to FIG. 2, cryostat 30 includes a tubing 34 which has a finned portion 33 wound around a cylindrical mandrel 35 and then extends in helical coils 31 beyond a sensor assembly 44 axially coupled to one end of mandrel 35. The end of tubing 34 at helical coil 31 has a nozzle 32 which provides an exit or discharge for coolant flowing through tubing 34. Nozzle 32 is positioned so that coolant flowing out of tubing 34 is tangential to inner flask 21 at cylindrical portion 23 just behind end cap 24. FIG. 3 shows an end view of helical coil 31, the position of nozzle 32 and mandrel 35. The radius of curvature of helical coil 31 is sufficiently large so that there is a snug fit between helical coil 31 and cylindrical portion 23 of flask assembly 20. Such a fit supports helical coil 31 when pressurized coolant is passed therethrough. A wicking element 16 is positioned within coil 31. Wicking element 16 is made of a material such as blotting paper and serves to diffuse and store coolant adjacent infrared detector 11. Finned portion 33 of tubing 34 around mandrel 35 provides back pressure and promotes heat transfer between the gas flowing within tubing 34 and gas exiting cylindrical portion 23.

Figure 4:
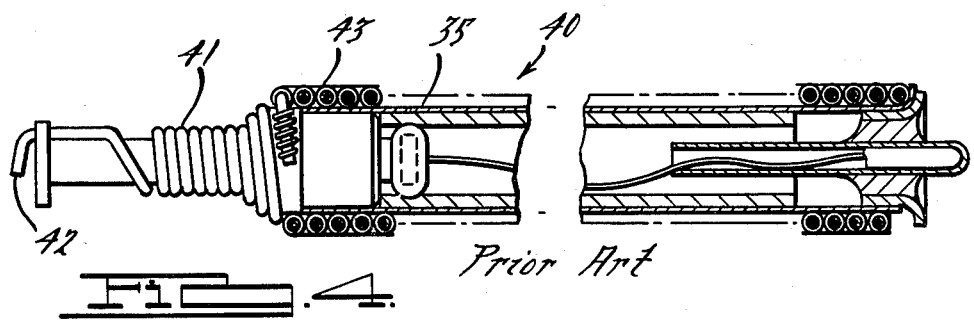
FIG. 4 is a longitudinal, partly sectional view similar to FIG. 2, of a cryostat in accordance with the prior art.

The prior art as shown in FIG. 4 includes a prior art cryostat 40 with finned tubing 43 in communication with coils 41 having at the end thereof a nozzle 42. Coils 41 of the prior art extend past mandrel 35 so that nozzle 42 is positioned to emit the coolant from cryostat 40 in a radial direction directed at inner flask 21. Radial impact on inner flask 21 by the coolant causes greater acoustical noise than in an embodiment of the present invention. Further, nozzle 42 is positioned adjacent the end of mandrel 35 and thus spaced further from infrared detector 11 than nozzle 32 of the embodiment of FIG. 2 in accordance with this invention. The closer positioning of nozzle 32 to infrared detector 11 promotes more rapid cooling.

Flask assembly 20 is designed to withstand liquid nitrogen at a temperature of $-196°$ C. A typical minimum flask wall thickness is 0.018 inches for both inner flask 21 and outer flask 22. Inner flask 21 is designed to withstand an internal pressure of 350 plus or minus 50 pounds per square inch. Tubing 34 is formed of a conductive material, such as stainless steel, and is grounded. Electrostatic charge acquired by the coolant as it leaves the exit nozzle is discharged as the gas comes back in contact with the grounded helical coil 31. Reducing the amount of electrostatic charge reduces the noise introduced into infrared detector 11.

The size of helical coils 31 are such that they snuggly fit within cylindrical portion 23. Thus, when highly pressurized gases are introduced into cryostat 30 a radially outward force presses helical coils 31 against the interior of inner flask 21 and stabilizes both the coils 31 and the nozzle 32. Also, there are a sufficient number of turns in coils 31, for example five, and advantageously at least one full turn, to support nozzle 32 when passing coolant. Maintaining the proper position of nozzle 32 minimizes eddy flow currents and the impact of coolant on end cap 24 or inner flask cylindrical wall 23.

Typical dimensions for cryostat assembly 10 include a length of 2.5 inches for flask assembly 20, a radius of 0.140 inches for outer flask 22 adjacent infrared detector 11, a length of 1.34 inches for finned portion 33, a diameter of 0.126 for helical coils 31 and a diameter of 0.23 inches for finned tubing 33. The diameter of cylindrical portion 23 can be about 0.134 inches.

OPERATION

Cooling of infrared detector 11 occurs when coolant gas is applied to gas probe receptacle 12. The gas flows through valve assembly 13, into cryostat 30, through finned portion 33, through helical coils 31 and exits through nozzle 32. The gas cools upon expansion as it leaves the small orifice of the nozzle 32. After expansion, the cooled gas flows along the outside of heat exchanging finned tubing 33 and extracts heat from the incoming gas inside finned tubing 33. There results a cyclical cooling action wherein subsequent incoming gas is cooler than the previous incoming gas. The process continues until the gas exiting nozzle 32 is sufficiently low in temperature to liquify upon expansion. A wicking material, such as blotter paper 16 retains the liquid coolant adjacent infrared detector 11. As the liquid flows along the outside of finned tubing 33, it changes phase to gas and repeats the process described above, cooling the incoming gas.

Temperature sensor 14 changes resistance with temperature and through sensing lead 15 and the connector on valve assembly 13, indicates the temperature of the sensor to the external cycling circuit. When the sensor indicates a particular resistance (temperature), the cycling circuit applies a voltage to the solenoid valve located in the valve assembly 13, closing the valve and stopping the input of gas. When the sensor indicates another particular resistance (corresponding to a warmer temperature), the cycling circuit removes the voltage to the solenoid valve allowing gas to once again enter cryostat 30. The gas flow will cycle at regular intervals. An electrostatic charge is imparted the gas as it exits the nozzle 32. As the gas contacts the grounded helical coils 31, the charge is removed.

The electrical discharge of the coolant provided by contact with the grounded helical coils 31 insures a minimum amount of electrostatic noise in infrared detector 11. Nozzle 32 distributes the coolant against inner flask 21 in a circumferential path such that there is not an abrupt change in direction by the coolant inducing microphonic pickup by the infrared detector 11. The reduction in noise provided by this invention is sufficient that there need not be a conductive or silver coating on the walls of inner flask 21. As already stated above, omitting the inner coating greatly simplifies manufacturing and decreases the failure rate of the refrigerated detector unit 10.

Once infrared detector 11 has cooled down sufficiently, infrared radiation passing through an outer flask dome portion 47 and impinging upon infrared detector 11 causes an output current which is then detected and processed by appropriate circuitry.

Various modifications and variations will no doubt occur to those skilled in the various arts to which this invention pertains. For example, the relative sizes of the cryostat and helical coils may be varied from that described herein. These and all variations which basically rely on the teachings through which this disclosure has advanced the art are properly considered within the scope of this invention.

I claim:

1. A cryostat assembly for an infrared detection device comprising:
a substantially electrically insulating interior wall member for defining at least a portion of the boundary of a recess adapted to contain a coolant such as, for example, nitrogen, said wall member having a cylindrical portion; and
a cryostat means provided within said recess for guiding the coolant and having an exit nozzle for distributing the coolant from said cryostat means at a position adjacent said cylindrical portion and in a direction tangential to an adjacent portion of said cylindrical portion so as to reduce the force of impingement of the coolant on said cylindrical portion with respect to a radial impingement of the coolant on said cylindrical portion thus reducing noise sensed by the infrared detection device.

2. A cryostat assembly as recited in claim 1 wherein: said cryostat means includes a helical configuration so that said cryostat means substantially follows the curvature of and is adjacent to the interior of said cylindrical portion, said helical configuration having a sufficient number of coils so as to provide structural support for said exit nozzle when pressurized coolant is passed through said cryostat means.

3. A cryostat assembly as recited in claim 2 wherein: said coils are positioned sufficiently close to said cylindrical portion so that upon pressurization of said cryostat means said coils deflect radially and abut the interior of said cylindrical portion and said cryostat means and said wall member cooperate to support said exit nozzle.

4. A cryostat assembly as recited in claim 3 wherein: said cryostat means has an electrically conductive surface area sufficiently large to remove substantially all of the electrostatic charge on the coolant discharged into said recess from said exit nozzle and passing over said cryostat means, thus further reducing noise sensed by the infrared detection device.

5. A cryostat assembly as recited in claim 4 wherein: said cylindrical portion of said wall member includes an endcap for supporting the infrared detection device.

6. A cryostat assembly as recited in claim 5 further comprising a wick means positioned in a core portion defined by said coils for acting as a damper for coolant flow and as a temporary storage for coolant so as to reduce the temperature of the infrared device.

7. A cryostat assembly as recited in claim 6 further comprising an exterior member spaced from said interior wall member and adapted to define a vacuum therebetween.

8. A cryostat assembly for an infrared detection device comprising:
an outer glass wall;
an inner glass wall spaced from said outer glass wall and defining therebetween a space adapted for evacuation to form a vacuum, a portion of said inner glass wall having a substantially cylindrical shape with a first end closed to support the infrared detection device, and a second end open and adapted for receiving a coolant; and
a cryostat means for guiding a coolant in a helical path adjacent the interior of said inner glass wall to a position adjacent said first end, said cryostat means having an end opening adjacent said first end so that coolant dispensed from said end opening into the interior of said inner glass wall is adjacent said first end and the infrared device and the coolant is deflected from directly striking said inner glass wall, said cryostat means being formed of an electrically conductive metal which is connected to ground so electrostatic charge can be removed from the coolant, and both electrical noise and acoustical noise at the infrared detection device is reduced without the need for a conductive coating on said inner glass wall.

9. A cryostat assembly as recited in claim 8 wherein said helical conduit is wrapped around a wick means for diffusing said coolant when it exits from said conduit means and for acting as a reservoir of said coolant thus improving cooling of the infrared device.

10. A cryostat assembly as recited in claim 9 wherein said cryostat means has at least one full turn adjacent said end opening to support said cryostat means in cooperation with said inner glass wall when said cryostat means is pressurized by said coolant.

11. A method of cooling an infrared detection device using a cryostat assembly comprising the steps of:
injecting a coolant material from a cryostat including a coolant conduit adjacent a cylindrical wall in a direction tangential to the wall so that there is a reduced amount of turbulence in the coolant and there is produced a reduced amount of noise when striking the cylindrical wall; and
passing the coolant over a conductive portion of the cryostat coolant conduit to discharge electrostatic charge from the coolant.

12. A method as recited in claim 11 further comprising the steps of:
stabilizing an exit nozzle for the coolant by providing a cooperating action between the cryostat coolant conduit and the cylindrical wall so that when pressurized coolant is passed through the cryostat coolant conduit, the cryostat coolant conduit abuts the cylindrical wall thus providing for position stabilization of the nozzle.

* * * * *